(12) United States Patent
Kocaman

(10) Patent No.: US 6,927,606 B2
(45) Date of Patent: Aug. 9, 2005

(54) LOW VOLTAGE DIFFERENTIAL TO SINGLE-ENDED CONVERTER

(75) Inventor: Namik Kocaman, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 11 days.

(21) Appl. No.: 10/267,054

(22) Filed: Oct. 7, 2002

(65) Prior Publication Data

US 2003/0048115 A1 Mar. 13, 2003

Related U.S. Application Data

(62) Division of application No. 09/836,738, filed on Apr. 16, 2001, now abandoned.

(51) Int. Cl.[7] .................................................. H03K 3/00
(52) U.S. Cl. ........................................ 327/108; 327/333
(58) Field of Search .......................... 327/108–112, 333, 327/436, 437; 326/62, 63, 82, 83

(56) References Cited

U.S. PATENT DOCUMENTS

| | | | |
|---|---|---|---|
| 3,882,409 A | | 5/1975 | Yagi |
| 4,079,332 A | | 3/1978 | Padgett |
| 4,375,039 A | | 2/1983 | Yamauchi |
| 4,716,307 A | | 12/1987 | Aoyama |
| 4,808,853 A | | 2/1989 | Taylor |
| 5,039,873 A | * | 8/1991 | Sasaki .................... 327/237 |
| 5,283,482 A | | 2/1994 | Chen |
| 5,406,221 A | | 4/1995 | Samani |
| 5,430,765 A | | 7/1995 | Nagahori |
| 5,525,919 A | * | 6/1996 | Phelan .................... 327/52 |
| 5,821,799 A | * | 10/1998 | Saripella ................ 327/333 |
| 5,834,974 A | | 11/1998 | Kim |
| 5,847,607 A | | 12/1998 | Lewicki et al. |
| 5,929,654 A | | 7/1999 | Park et al. |
| 5,939,904 A | | 8/1999 | Fetterman |
| 6,028,454 A | * | 2/2000 | Elmasry et al. ........ 326/115 |
| 6,150,881 A | | 11/2000 | Lovelace et al. |
| 6,265,941 B1 | | 7/2001 | Lapota |
| 6,340,899 B1 | | 1/2002 | Green |
| 6,424,194 B1 | | 7/2002 | Hairapetian |
| 6,448,821 B1 | * | 9/2002 | Sakurai .................. 327/56 |
| 6,483,383 B2 | | 11/2002 | Wu |
| 6,531,896 B1 | * | 3/2003 | Song ...................... 326/86 |

FOREIGN PATENT DOCUMENTS

DE          100 24 690 A 1          11/2000

* cited by examiner

*Primary Examiner*—Kenneth B. Wells
(74) *Attorney, Agent, or Firm*—Christie, Parker & Hale, LLP

(57) ABSTRACT

Method and circuitry for converting a differential logic signal to a single-ended logic signal eliminate slower PMOS transistors and speed up the conversion process. In specific embodiments differential logic signals of the type employed in, for example, current-controlled complementary metal-oxide-semiconductor (C3MOS) logic are converted to single-ended rail-to-rail CMOS logic levels using a differential pair of NMOS transistors with resistors as load devices and an NMOS current source transistor that provides dynamically adjusted tail current.

13 Claims, 4 Drawing Sheets

LOW VOLTAGE DIFFERENTIAL TO SINGLE-ENDED CONVERTER

CROSS-REFERENCES TO RELATED APPLICATIONS

This application is a divisional of co-pending U.S. patent application Ser. No. 09/836,738, filed Apr. 16, 2001, now abandoned which disclosure is incorporated herein by reference for all purposes.

BACKGROUND OF THE INVENTION

The present invention relates in general to integrated circuits, and in particular to improved method and circuitry for converting a differential logic signal of the type employed in, for example, current-controlled complementary metal-oxide-semiconductor ($C^3MOS$) logic, to single-ended logic signal employed in standard CMOS logic.

Converting signals from $C^3MOS$ format which is differential in nature to standard CMOS format which is single-ended with rail-to-rail amplitude is a difficult operation. Most conversion circuits require careful optimization to "shape" the single-ended rail-to-rail signal. FIG. 1 depicts a conventional converter circuit with a conventional differential stage 100 that receives a differential signal Vin+/Vin−. Two optimized CMOS inverters 102 and 104 made up of transistors with skewed channel width to length W/L ratios, shape the output signal of differential stage 100. The rail-to-tail CMOS signal is obtained at output $V_{OUT}$.

There are a number of disadvantages associated with this common signal level conversion technique. The two additional inverters (102 and 104) introduce long delays that may become unacceptable for ultra high speed applications such as those using $C^3MOS$ logic. Further, the delay tends to be highly variant with process corners and temperature. Moreover, the delay for the high-to-low transition is typically not equal to the delay for the low-to-high transition in the optimized inverters. This causes timing problems and, for clock signals, duty cycles deviating from 50%. Other drawbacks of most CMOS differential to single-ended converters are caused by the use of p-channel MOS (or PMOS) transistors. PMOS transistors are inherently as much as three to four times slower than NMOS transistors, and therefore aside from problems such as duty cycle distortion that is caused by this mismatch in speed, tend to slow down the overall operation of the converter circuit. Moreover, when used as load devices (as is often the case in CMOS level converter circuits), PMOS transistors introduce additional parasitic capacitance that further slows down certain internal nodes of the circuit.

There is therefore a need for differential to single ended signal level converters that operate effectively at very high speeds.

BRIEF SUMMARY OF THE INVENTION

The present invention provides method and circuitry for converting a differential signal to a single-ended signal for low-voltage high speed circuit applications. Broadly, the invention eliminates PMOS transistors from the differential to single-ended converter circuitry to reduce parasitic capacitive loading. Further speed enhancements are achieved by employing a feedback mechanism to adjust the tail current of the converter circuit. In a specific embodiment, resistors replace load PMOS transistors, and the circuit is configured to be disabled when not in use to eliminate static current.

Accordingly, in one embodiment, the present invention provides a circuit for converting a differential logic signal to a single-ended logic signal, including: a first NMOS transistor having a gate terminal coupled to receive a first half of the differential logic signal, a source terminal and a drain terminal; a second NMOS transistor having a gate terminal coupled to receive a second half of the differential logic signal, a source terminal coupled to the source terminal of the first NMOS transistor and a drain terminal; a first resistor coupled between the drain terminal of the first NMOS transistor and a logic high node; a second resistor coupled between the drain terminal of the second NMOS transistor and the logic high node; and a third NMOS transistor having a gate terminal coupled to the drain terminal of the first NMOS transistor, a source terminal coupled to a logic low node, and a drain terminal coupled to the source terminals of the first and second NMOS transistors.

In a more specific embodiment of the present invention the converter further includes a first CMOS inverter having an input terminal coupled to the drain terminal of the second NMOS transistor; and a second CMOS inverter having an input terminal coupled to an output terminal of the first inverter. In a yet more specific embodiment, the converter includes a fourth NMOS transistor coupled between the source terminal of the third NMOS transistor and the logic low node with a gate terminal coupled to an enable signal.

In another embodiment, the present invention provides a CMOS circuit comprising: a first circuit implemented in $C^3MOS$ logic wherein logic levels are signaled by current steering in one of two or more branches in response to a differential input signal; a differential signal to single-ended signal converter coupled to the first circuit, the converter including a differential stage with resistive loads instead of PMOS transistors and a dynamically adjusted tail current configured to convert the differential signal from the first circuit to a single-ended CMOS logic signal; and a second circuit coupled to the converter to receive the single-ended CMOS logic signal and implemented in standard CMOS logic wherein substantially zero static current is dissipated.

In yet another embodiment the present invention provides a method of converting a differential logic signal to a single-ended logic signal including receiving a differential logic signal at inputs of a differential pair of NMOS transistors; pulling up a signal at drain terminals of the pair of NMOS transistors using resistors instead of PMOS transistors; and feeding back an output signal to dynamically adjust a current through the NMOS transistors. The dynamic adjustment of the tail current speeds up the switching operation and provides proper CMOS logic output levels.

The detailed description and the accompanying drawings provide a better understanding of the nature and advantages of the signal level converter of the present invention.

DETAILED DESCRIPTION OF THE INVENTION

Signal levels used in CMOS logic are rail-to-rail, meaning that the signal is typically single-ended with its high logic level typically determined by the positive power supply (e.g., 1.8V) and its low logic level determined by ground (or the negative power supply). Certain types of logic circuitry, such as high speed current-controlled CMOS logic (or $C^3MOS$ logic), use differential logic signals. Differential $C^3MOS$ logic processes differential signals that typically have amplitudes less than one volt, e.g., 500 mV peak-to-peak single-ended. The present invention provides fast and efficient method and circuitry for converting such a differential logic signal to a rail-to-rail single-ended one.

Figure 2:
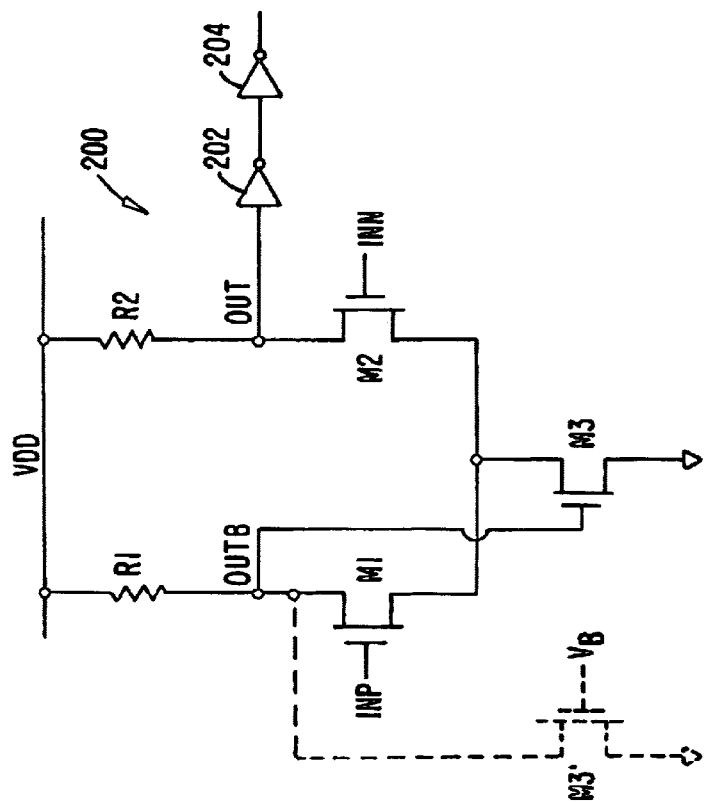
FIG. 2 shows one embodiment of the differential to single-ended converter according to the present invention.

Referring to FIG. 2, there is shown one embodiment of the present invention. According to this embodiment, no PMOS transistors are used as part of the converter circuit 200. A pair of NMOS transistors M1 and M2 receive the differential logic signal INP and INN at their gate terminals, respectively. Resistors R1 and R2 act as load devices for transistors M1 and M2, respectively, connecting their drain terminals to the logic high node, or power supply node VDD. Resistors R1 and R2 may be made of, for example, polysilicon material or other similar resistive materials. A third NMOS transistor M3 connects between the common source node of transistors M1 and M2 and logic low node, or ground. The gate of transistor M3 connects to the drain of transistor M1. The drain of transistor M1 is a slower complementary output OUTB of converter 200, while the drain of transistor M2 provides the faster output OUT of converter 200. The output of converter 200 may be followed by a couple of CMOS inverters 202 and 204.

The operation of the converter circuit shown in FIG. 2 is as follows. When the differential signal (INP-INN) is at a logic low level, transistor M2 is turned on carrying the tail current, and transistor M1 is turned off, pulling output node OUT close to ground (or logic low). When (INP-INN) switches from logic low to logic high, the tail current through transistor M3, I(M3), starts to flow more through transistor M1. This causes a voltage drop across load resistor R1 pulling the voltage at node OUTB down toward ground. This in turn reduces the drive voltage at the gate of transistor M3 reducing its current I(M3). As the current through transistor M3 decreases, it requires a smaller (INP-INN) voltage to switch transistor M2 off. This feedback mechanism therefore helps to speed up transistor M2 switching off and node OUT rise toward VDD through resistor R2.

In the other direction, when the differential input signal (INP-INN) switches from logic high to logic low, transistor M3 starts with a low signal at its gate and therefore draws a small amount of current I(M3). With a relatively small I(M3), it requires a smaller (INP-INN) to steer the current from transistor M1 to transistor M2. As the current starts to flow through transistor M2, node OUT starts to move down toward ground and node OUTB moves up toward VDD. This in turn increases the voltage at the gate of transistor M3 causing a larger I(M3) to discharge OUT faster.

Thus, converter 200 operates to quickly charge and discharge output node OUT between VDD and ground in response to the differential input signal. The use of resistors R1 and R2 instead of PMOS transistors eliminates parasitic capacitances at output nodes OUT and OUTB. The feedback mechanism that adjusts the tail current I(M3) further enhances the switching speed at output node OUT. Node OUTB does not switch as fast as OUT in part because of the capacitive loading introduced by the gate of transistor M3. However, this does not adversely impact the switching speed of output node OUT.

Converter 200 is particularly well suited for low voltage applications. This is in part because by replacing the PMOS load transistors with resistors, the circuit requires less voltage headroom. That is, instead of three stacked transistors between the power supplies, there only needs to be two plus the voltage drop across R1 which can be minimized. Furthermore, because of the feedback arrangement between OUTB and the gate of transistor M3, a small swing at OUTB can provide sufficient change in the current drive of transistor M3. The voltage at OUTB therefore may swing not much more than a threshold voltage for an NMOS transistor. Alternatively, if the circuit is to be used in a high voltage application, an additional current source can be employed to adjust the mid-point of the voltage swing at OUTB. This alternative embodiment is depicted in phantom in FIG. 2 where NMOS transistor M3' with its gate receiving a bias voltage VB provides the additional current source.

Figure 1:
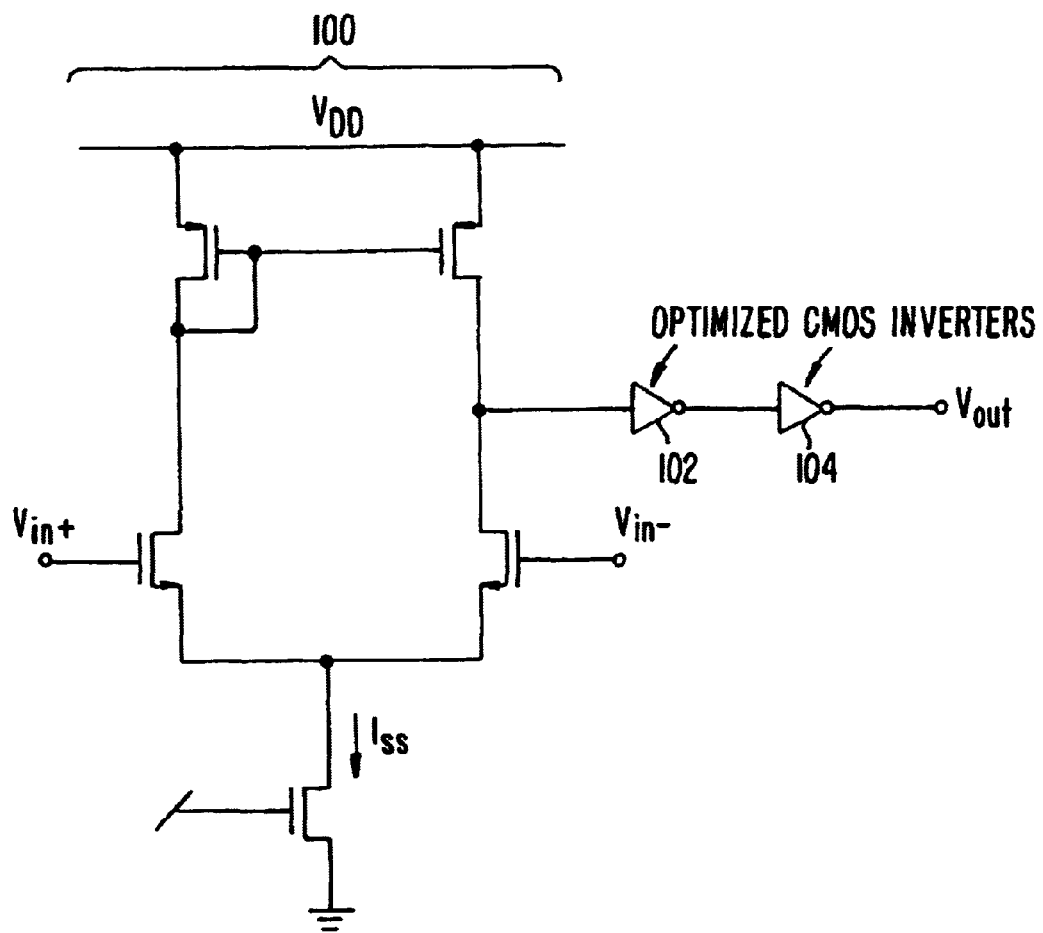
FIG. 1 shows a conventional CMOS differential to single-ended converter circuit.
Figure 3A:
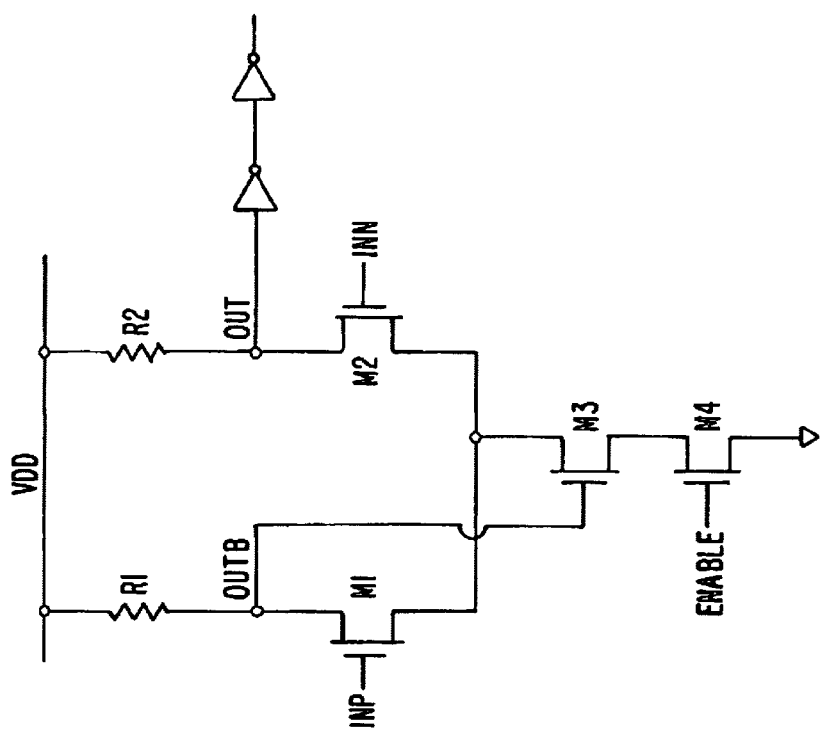
FIGS. 3A and 3B show alternative implementations for the differential to single-ended logic signal converter according to an embodiment that allows the converter to be disabled.
Figure 3B:
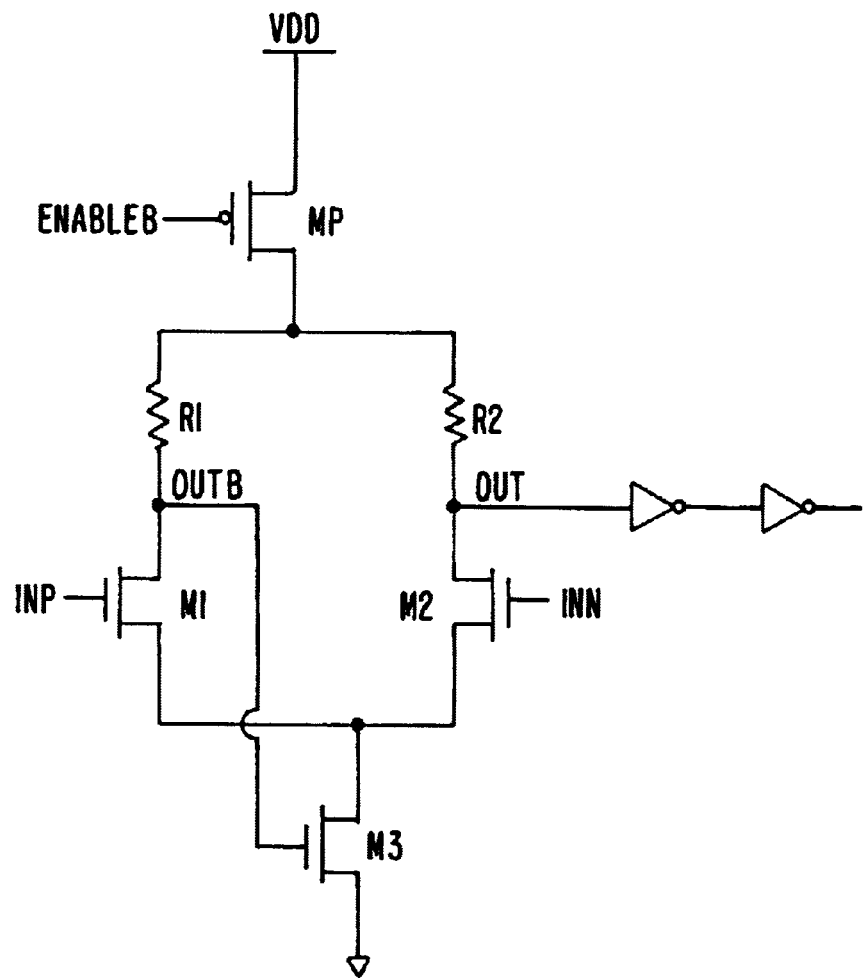

Converter circuit 200 as shown in FIG. 2 dissipates some static current. When used in a larger circuit, however, converter 200 may not need to be active at all times. To eliminate the static current when the converter circuit is not in use, in an alternate embodiment, the present invention inserts an enable transistor M4 between M3 and ground. This embodiment is shown in FIG. 3A. When the signal ENABLE at the gate terminal of transistor M4 is low, transistor M4 is turned off disconnecting the current path to ground and disabling converter 200. In an alternative embodiment, an ENABLE mechanism is provided using a PMOS transistor between load resistors R1/R2 and output logic high (VDD) as shown in FIG. 3B. Since the drain terminal of PMOS transistor MP is a common mode node, it will not slow down the switching operation. When disabled (i.e., ENABLEB=logic high or VDD), PMOS transistor MP will disconnect the positive power supply VDD from nodes OUT and OUTB. This will cause OUT and OUTB nodes to get discharged down to ground (or negative power supply), effectively turning off the static power consumption. When enabled (ENABLEB—logic low) during normal operation, there will be a negligible voltage drop (e.g., ~10 mV) across PMOS transistor MP which will not degrade the swing of OUT significantly.

In an exemplary embodiment, the power supply for the converter is at, e.g., 1.2V, resistors R1 and R2 may have values of, e.g., 1 KΩ, and all NMOS transistors may have channel sizes of, e.g., 4μ/0.13μ. Such exemplary converter circuitry can convert a differential signal to a single-ended 200 mV to 1.2V signal at very high speeds.

Figure 4:
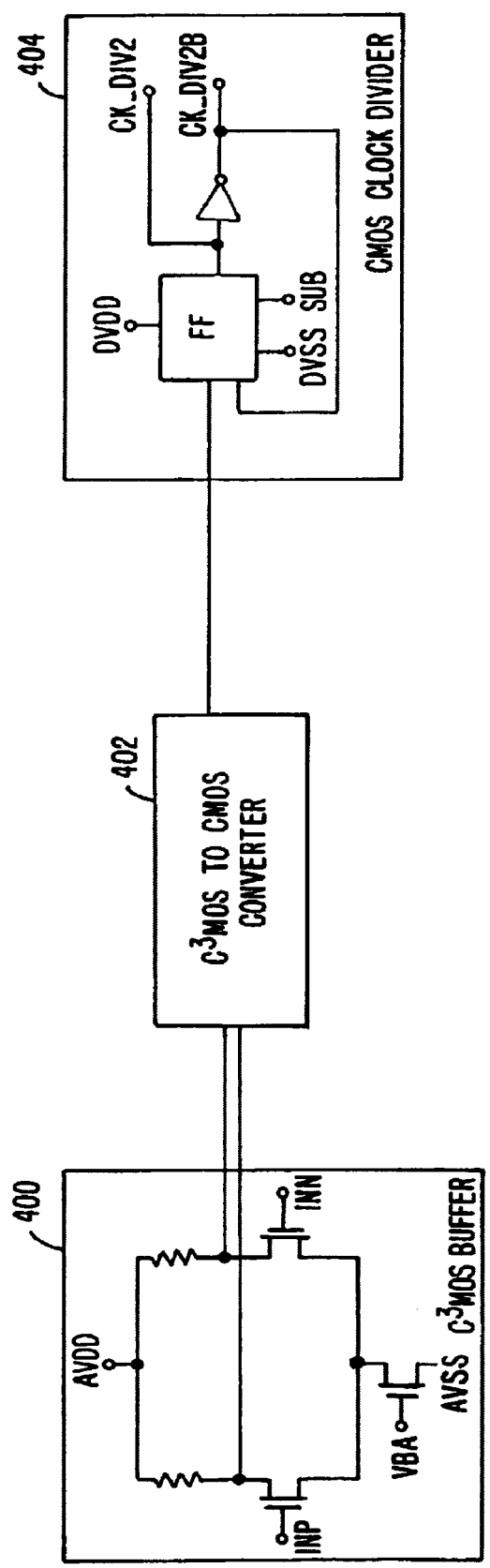
FIG. 4 shows an exemplary circuit application for the differential logic signal to single-ended logic signal converter according to an illustrative embodiment of the invention.

According to another embodiment of the present invention ultra high speed CMOS circuitry is implemented using the differential to single-ended converter of the type shown in FIGS. 2 or 3. Ultra high speed circuit applications such as synchronous optical netwotk (SONET) process signals in the several GigaHertz range. To implement such high speed circuitry using standard silicon CMOS technology, the high speed signals are first processed using the faster differential $C^3MOS$ logic and are then divided down in frequency and converted to CMOS logic for further processing by standard CMOS logic circuitry. This aspect of the invention is further described in greater detail in commonly-assigned copending patent application Ser. No. 09/484,856, titled "Current-Controlled CMOS Logic Family," by Hairapetian, filed Jan. 18, 2000, which is hereby incorporabed by reference in its entirety. Referring to FIG. 4, there is shown an exemplary circuit application for the signal level converter according to an embodiment of the present invention. In this illustrative examgle, a high speed buffer 400 implemented in C³MOS logic processes differential C³MOS logic signals that are to be converted to standard rail-to-rail CMOS logic signal for further processing by conventional CMOS logic. The differential output of buffer 400 is applied to the differential input of converter 402. Converter 402 is of the type shown in FIGS. 2 or 3 and converts the differential signal to a single-ended CMOS logic signal that is then applied, in this example, to a divide-by-two circuit 404. Divide-by-two circuit 404 is implmented using standard CMOS logic and operates to divide down the frequency of the signal for further processing by downstream CMOS logic circuitry. It is to be understood that in other embodiment C³MOS buffer 400 may be any other ype of C³MOS logic (e.g., flip-flops, AND, OR, EXOR gates, and the like), and divide-by-two circuit 404 may similarly be any other type of logic circuitry using standard CMOS logic signals.

The present invention thus provides method and circuitry for converting a differential signal to a single-ended signal for high speed circuit applications. The invention eliminates PMOS transistors from the converter circuitry and instead uses resistors to reduce parasitic capacitive loading. Further speed enhancements are achieved by employing a feedback mechanism to adjust the tail current of the converter circuit. While the above provides a complete description of specific embodiments of the present invention, it is possible to use various alternatives, modifications and equivalents. Therefore, the scope of the present invention should not be limited to the specific and illustrative embodiment described above, and should instead be determined with reference to the appended claims along with their full scope of equivalents.

What is claimed is:

1. A complementary metal-oxide-semiconductor circuit comprising:
   a first circuit implemented in current-controlled CMOS logic wherein logic levels are signaled by current steering in one of two or more branches in response to a differential input signal;
   a differential signal to single-ended signal converter coupled to the first circuit, the converter including a differential stage with resistor loads and a dynamically adjusted tail current and configured to convert the differential signal from the first circuit to a single-ended CMOS logic signal; and
   a second circuit coupled to the converter to receive the single-ended CMOS logic signal and implemented in CMOS logic wherein substantially zero static current is dissipated, wherein the differential signal to single-ended signal converter further comprises:
   a differential pair of input NMOS transistors each coupled to a logic high node via a respective load resistor; and
   a current source NMOS transistor coupled between the differential pair of input NMOS transistors and a logic low node, and having a gate coupled to a drain terminal of one of the differential pair of input NMOS transistors.

2. A complementary metal-oxide-semiconductor circuit comprising:
   a first circuit implemented in current-controlled CMOS logic wherein logic levels are signaled by current steering in one of two or more branches in response to a differential input signal;
   a differential signal to single-ended signal converter coupled to the first circuit, the converter including a differential stage with resistor loads and a dynamically adjusted tail current and configured to convert the differential signal from the first circuit to a single-ended CMOS logic signal; and
   a second circuit coupled to the converter to receive the single-ended CMOS logic signal and implemented in CMOS logic wherein substantially zero static current is dissipated, wherein the differential signal to single-ended signal converter comprises:
   a first NMOS transistor having a gate terminal coupled to receive a first half of a differential logic signal from a first branch of the first circuit, a source terminal, and a drain terminal;
   a second NMOS transistor having a gate terminal coupled to receive a second half of a differential logic signal from a second branch of the first circuit, a source terminal coupled to the source terminal of the first NMOS transistor, and a drain terminal;
   a first resistor coupled between the drain terminal of the first NMOS transistor and a logic high node;
   a second resistor coupled between the drain terminal of the second NMOS transistor and the logic high node; and
   a third NMOS transistor having a gate terminal coupled to the drain terminal of the first NMOS transistor and not coupled to the second NMOS transistor, a source terminal coupled to a logic low node, and a drain terminal coupled to the source terminals of the first and second NMOS transistors.

3. The circuit of claim 2, wherein the second circuit is coupled to the converter at the drain terminal of one and not the other of the first and second NMOS transistors.

4. The circuit of claim 3, wherein the second circuit is coupled to the converter at the drain terminal of the second NMOS transistor.

5. The circuit of claim 4, wherein a signal at the drain terminal of the first NMOS transistor switches slower than a signal at the drain terminal of the second NMOS transistor.

6. The circuit of claim 2, wherein the first, second, and third NMOS transistors are of substantially the same size.

7. The circuit of claim 2, wherein the first and second resistors are substantially made up of polysilicon material.

8. The circuit of claim 2, further comprising a fourth NMOS transistor having a gate terminal coupled to an enable signal and further having a drain terminal and a source terminal coupled between the source terminal of the third NMOS transistor and the logic low node.

9. The circuit of claim 2, further comprising a PMOS transistor inserted between the logic high node and the first and second resistors with a gate terminal coupled to an enable signal.

10. The circuit of claim 2, wherein the logic high node is a positive power supply node and the logic low node is ground.

11. The circuit of claim 10, wherein the positive power supply node carries a voltage that is less than 1.5 volts.

12. The circuit of claim 2, further comprising a current source device coupled to the drain terminal of the first NMOS transistor.

13. The circuit of claim 12, wherein the current source device comprises a fourth NMOS transistor having a drain terminal coupled to the drain terminal of the first NMOS transistor, a source terminal coupled to the logic low node, and a gate terminal coupled to a bias voltage.

* * * * *